April 14, 1970 V. A. DHAKA 3,506,893

INTEGRATED CIRCUITS WITH SURFACE BARRIER DIODES

Filed June 27, 1968 2 Sheets-Sheet 1

INVENTOR
VIR A. DHAKA

BY J. B. Kraft
ATTORNEY

United States Patent Office 3,506,893

Patented Apr. 14, 1970

3,506,893

INTEGRATED CIRCUITS WITH SURFACE BARRIER DIODES

Vir A. Dhaka, Poughkeepsie, N.Y., assignor to International Business Machines Corporation, Armonk, N.Y., a corporation of New York Filed June 27, 1968, Ser. No. 740,719

Int. Cl. H01l *19/00*

U.S. Cl. 317—235 28 Claims

ABSTRACT OF THE DISCLOSURE

An integrated circuit containing a surface barrier diode utilizing the Schottky effect. The Schottky-barrier diode is formed in a high resistivity epitaxial layer which contains other semiconductor devices forming an integrated circuit. The epitaxial layer has a thickness of less than 2.5 microns and an impurity concentration of less than $5 \times 10^{16}$ cm.$^{-3}$ at the surface. The diode comprises a metallic rectifying contact formed on the surface of the epitaxial layer opposite to and spaced by a distance of less than 0.5 micron from a low resistivity region formed in said epitaxial layer by out-diffusion from a corresponding region in a semiconductor substrate supporting the epitaxial layer. Suitable electrical connections couple the rectifying contact and the low resistivity epitaxial region to other devices in the circuit, e.g., the low resistivity region is coupled to a collector and the contact coupled to a base of a transistor providing a diode shunt across the collector-base junction which prevents saturation of the transistor.

BACKGROUND OF THE INVENTION

Field of the invention

The present invention relates to monolithic integrated semiconductor circuits, and especially logic circuits which can be used in computers. More particularly, it relates to integrated circuits containing incorporated Schottky-barrier diodes utilizable in high speed switching circuits for such computers.

Description of the prior art

Surface barrier diodes utilizing the Schottky effect based upon the rectifying characteristics exhibited by a metal to semiconductor interface are well known. Schottky-barrier diodes, also called "hot carrier" diodes, have, in addition, been known to exhibit fast switching speeds in the order of pico-seconds as well as low forward turn-on voltages. Accordingly, Schottky-barrier diodes would be very desirable in integrated monolithic circuits utilized in the present day high speed computer art.

However, past efforts to provide commercially practical integrated circuits containing Schottky-barrier diodes have been less than successful. To a considerable extent, this has been due to an inability to provide a Schottky-barrier diode circuit element in an integrated circuit which displays primarily non-linear characteristics. Where the diode circuit element displays a substantial linear resistance characteristic, the high switching speed advantage of such diodes as well as the low forward turn-on voltage characteristics are significantly diminished. This is particularly true if the Schottky-barrier diode is to be used as a non-linear negative feedback or shunt across the collector-base junction of a high speed switching transistor to keep the transistor out of the saturated state.

It has been recognized in transistor pulse circuits of the type used in digital information and handling systems such as computers, that over-driving the transistor to the point that the collector-base junction becomes forward-biased results in attendant saturation causing undesirable minority carrier storage which increases the turn-off or switching time. Diodes such as tunnel diodes have been suggested as shunts or by-passes across the collector-base junction of switching transistors in an attempt to maintain such transistors below the saturation level. However, commercially practical tunnel diodes for such uses, particularly in integrated circuits, have not been produced. Other types of diodes do not have the high switching speeds and low forward turn-on voltages which make Schottky-barrier diodes so desirable in high speed switching circuits of present day and potential technologies.

SUMMARY OF THE INVENTION

Accordingly, it is an object of this invention to provide integrated circuits containing incorporated Schottky-barrier diodes.

It is a further object of this invention to provide an integrated circuit having a Schottky-barrier diode circuit element of predominantly non-linear characteristics.

It is still another object of this invention to provide integrated circuits having Schottky-barrier diodes connected to transistors.

It is a still further object of this invention to provide high speed non-linear switching monolithic integrated circuits containing Schottky-barrier diodes.

It is an even further object of this invention to provide a high speed integrated non-saturated switching circuit incorporating a Schottky-barrier diode.

It is yet a further object of this invention to provide a method of fabricating itnegrated circuits containing Schottky-barrier diodes.

It is yet a further object of this invention to provied a method of fabricating monolithic integrated circuits into which Schottky-barrier diodes may be incorporated without additional fabrication steps.

The integrated circuit of the present invention contains a Schottky-barrier diode structure comprising a high resistivity semiconductor substrate having a low resistivity region of one type conductivity formed along one portion of its surface, and a high resistivity epitaxial semiconductor layer of said one type conductivity on said surface. The epitaxial layer has a thickness of less than 2.5 microns, most preferably 2 microns or less, and a conductivity-determining impurity concentration of less than $5 \times 10^{16}$ cm.$^{-3}$ at the surface. A metallic rectifying contact is at the surface of said epitaxial layer opposite to a low resistivity epitaxial region corresponding to said low resistivity substrate region formed by out-diffusion from said substrate region across the substrate epitaxial layer interface. The metallic contact is spaced from said low resistivity epitaxial region by a distance of less than 0.5 micron. The integrated circuit includes electrical connections coupling the rectifying contact and the low resistivity epitaxial region respectively to other elements in the integrated circuit.

The high resistivity of the epitaxial layer containing the Schottky-barrier diode provides excellent barrier characteristics with the rectifying contact while the narrowness of this epitaxial layer together with the low resistivity out-diffused region which is spaced less than 0.5 micron from the rectifying contact provides a Schottky-barrier diode with only minimal linear resistance characteristics.

The incorporated Schottky-barrier diode functions most advantageously in the integrated circuit when utilized as a by-pass for the collector-base junction of a high speed switching transistor which is also formed in said epitaxial layer. In such a by-pass circuit, the rectifying metallic contact or anode of the barrier diode is coupled by conductive interconnector means to the base of the switching transistor, while the high resistivity epitaxial region adjacent said contact, which serves as the cathode of the diode, is coupled to the collector via the low resistivity epitaxial region and suitable conductive interconnector means. Because of the relatively low forward turn-on voltage of the Schottky-barrier diode, in the order of 0.4 volt, the base-collector junction, which requires in the order of 0.7 or 0.8 volt to become forward-biased, never reaches such a level because of the shunting effect of the diode. Consequently, the transistor is never driven into saturation. The transistor operates just below saturation which permits fast switching times.

The present invention also provides a method of fabricating a Schottky-barrier diode in the integrated circuit simultaneously with the formation of the transistor without the need for any additional fabrication steps. The low resistivity region of the diode is formed by out-diffusion into the epitaxial layer simultaneously with the formation of the low resistivity collector of the transistor in the epitaxy by a corresponding out-diffusion. A low resistivity channel from the surface of the epitaxial layer to the buried low resistivity region in the diode is formed simultaneously with a similar channel from the surface of the layer to the buried low resistivity collector region in the transistor. A diffused isolation region between the diode and the transistor may be formed in the same diffusion step as the isolation diffusion in the monolithic circuits. Finally, the metallization providing the rectifying contact of the Schottky-barrier diode may be deposited simultaneously with the metallization forming the ohmic contacts in the transistor.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
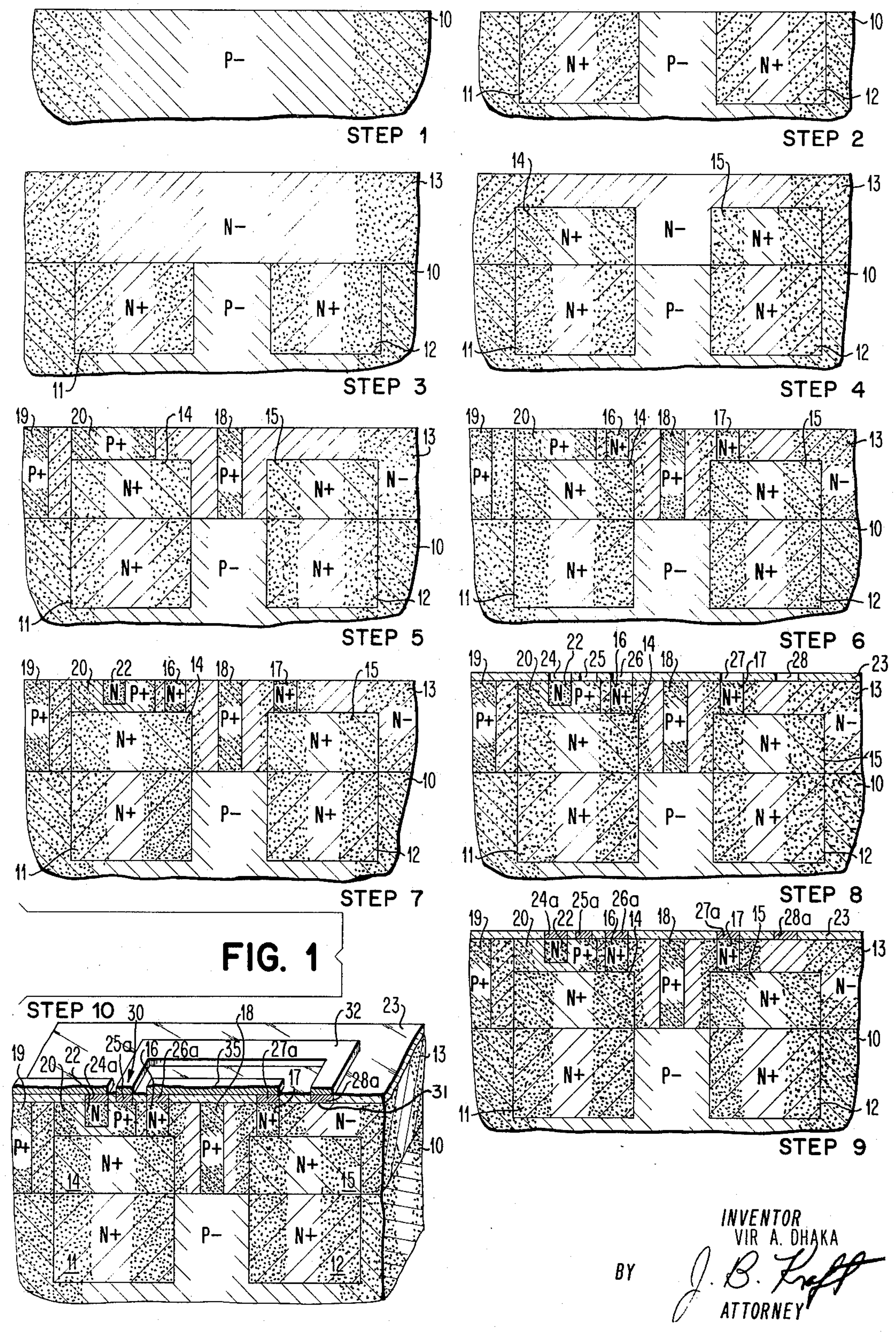
FIG. 1 is a flow diagram in cross-sectional form depicting the fabrication of the integrated circuit structure of one embodiment of the present invention.
Figure 2:
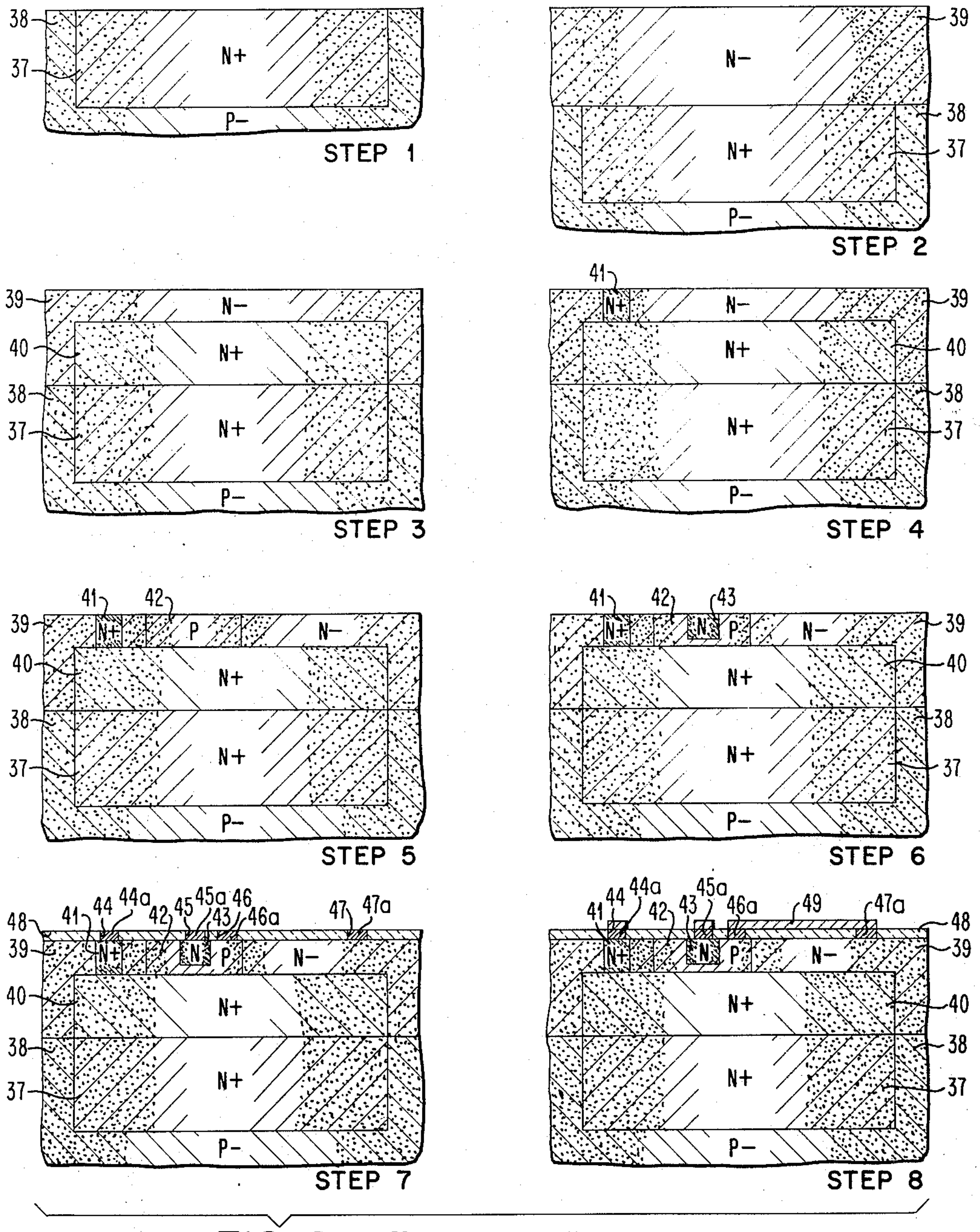
FIG. 2 is a flow diagram in cross-sectional form depicting the fabrication of the integrated circuit structure of another embodiment of the present invention.

In discussing the method of fabrication of the preferred embodiments as illustrated in FIGS. 1 and 2, the usual terminology that is well known in the semiconductor device will be used. By "carriers" is meant the free-holes or electrons which are responsible for the passage of current through a semiconductor material. Majority carriers are used in reference to those carriers in the material under discussion, i.e., holes in P type material or electrons in N type material. By use of the terminology "minority carriers," it is intended to signify those carriers in the minority, i.e., holes in N type material or electrons in P type material. In the most common type of semiconductor materials used in present day transistor structure, carrier concentration is generally due to the concentration of the conductivity-determining impurity, that is, impurities which impart conductivity characteristics to extrinsic semiconductor materials.

Although for the purpose of describing this invention reference is made to a semiconductor configuration wherein a P-type region is utilized as the substrate and subsequent semiconductor regions of the composite semiconductor structure are formed in the conductivity type described, it is readily apparent that the same regions that are referred to as being of one conductivity type can be of the opposite type conductivity and furthermore, some of the operations which are described as diffusion operations can be made by epitaxial growth.

Referring to FIG. 1, a wafer of P-type conductivity preferably having a resistivity in the order of 15–20 ohm-cm. and a thickness of about 7 to 10 mils, is used as the starting substrate 10 shown in Step 1. The substrate is preferably a monocrystalline silicon structure which can be fabricated by conventional techniques such as crystal-pulling from a melt containing the desired impurity concentration, followed by slicing the crystal into a plurality of wafers. This substrate may also be an epitaxial layer grown on another surface not shown. If such an epitaxial layer is used, it preferably has a thickness in the order of six microns.

A pair of spaced low resistivity N+ zones 11 and 12 are formed at the surface of substrate 10 in a conventional manner such as by diffusion. For example, a standard insulating coating, such as an oxide coating preferably of silicon dioxide having a thickness of approximately 5,000 A. is either thermally grown or deposited by pyrolitic deposition onto the suface of substrate 10. Alternatively, an RF sputtering technique as described in U.S. Patent 3,369,991 may be used to form the silicon dioxide layer. Then using a standard photoresist and acid etch technique, holes corresponding to zones 11 and 12 are formed in the silicon dioxide layer. Utilizing an arsenic or antimony impurity source, the arsenic impurity is diffused into the exposed surface to form zones 11 and 12 which have a sheet resistivity of 3 to 5 ohms per square. The depth of zones 11 and 12 is approximately 2 microns. When the diffusion is complete, the oxide layer is removed from the surface in the conventional manner, e.g., with a buffered HF solution.

In Step 3, N-epitaxial layer 13 having a majority carrier concentration (arsenic) below $5\times10^{16}$ cm.$^{-3}$, and a resistivity greater than 3 ohm-cm. is grown on the surface of substrate 10 by conventional techniques at temperatures of from 1000° to 1200° C. The epitaxial region has a thickness of approximately 2.0±.1 microns.

In Step 4, the low resistivity zones 14 and 15 are formed in the epitaxial layer with the application of sufficient heat to cause out-diffusion from corresponding zones 11 and 12. Zones 14 and 15 extend for approximately 1.5 microns into the epitaxial layer.

Next, low resistivity zones 14 and 15 are isolated from each other by a P+ diffusion carried out, preferably using a boron source, to form isolation zones 18 and 19, shown in Step 5, which traverse epitaxial layer 13 and terminate in the P-substrate. Zones 18 and 19 have a surface concentration in the order of $10^{20}$ cm.$^{-3}$. Subsequently, base diffusion 20 is made in a conventional manner in accordance with the techniques described above to provide a low resistivity P+ region extending from the surface of epitaxial layer 13 to N+ zone 14 forming therebetween collector-base junction 21, as shown in Step 5. Base region 20 has a sheet resistivity of 300 ohms per square.

In Step 6, low resistivity channels 16 and 17 are formed in epitaxial layer 13 by conventional diffusion techniques, as previously described, using a phosphorus source for the majority carriers. These channels have a low resistivity corresponding to that of zones 14 and 15; they provide a low resistivity path from zones 14 and 15 to the surface of the epitaxial layer.

Next, as shown in Step 7, emitter region 22 is formed by conventional diffusion techniques, preferably utilizing a phosphorus source such as phosphorus oxychloride. The sheet resistivity of emitter 22 is about 20 ohms per square.

Insulating layer 23 is then formed on the surface of epitaxial layer 13. Layer 23 is formed conventionally as previously described. It may be a thermal oxide such as silicon dioxide or an alternative insulating material such as silicon nitride. Using conventional photoresist and selective etching techniques, hole 24 exposing the surface of the emitter, hole 25 exposing the surface of the base, hole 26 exposing the surface of channel 16 which provides a low resistivity path to collector zone 14, hole 27 exposing the surface of channel 17 which provides a low resistivity path to low resistivity zone 15, and hole 28 exposing the surface of high resistivity epitaxial layer 13 opposite low resistivity zone 15 are opened in insulating layer 23. Step 8 illustrates this stage. Then, a thin layer of platinum in the order of 500 A. is deposited over the entire surface of the structure of Step 8. The platinum may be deposited by any conventional technique such as evaporation or sputtering. The substrate is then sintered in an inert atmosphere at a temperature of about 550° C. for a period of 20 minutes. The sintering operation produces an alloying of the platinum in holes 24, 25, 26, 27 and 28 with the exposed silicon, while the remainder of the platinum remains unaffected. The remaining or unalloyed platinum is then removed by suitable means such as selective etching with an etchant, e.g., aqua regia which will remove the platinum without affecting the alloy of platinum and silicon in the holes which will be referred to as platinum silicide. The platinum silicide is shown as areas 24*a*, 25*a*, 26*a*, 27*a* and 28*a*. Next, a layer of aluminum or other suitable metal such as molybdenum is evaporated over the entire surface of the structure. The evaporated layer of molybdenum has a thickness of several thousand A. units. A layer of photoresist is then applied over the wafer, dried, exposed, developed and fixed. The molybdenum interconnections 29 are formed by a conventional subtractive etching operation, e.g., one using a warm solution of phosphoric acid, nitric acid and water. The photoresist is then removed. The resulting structure is shown in Step 10. The platinum silicide deposits 24*a*, 25*a*, 26*a* and 27*a* are found to provide excellent ohmic contacts with the emitter, base and collector regions of transistor 30, and deposit 28*a* forms a good surface barrier or Schottky-barrier diode at surface area 31 of high resistivity epitaxial layer 13; deposit 28*a* is the anode.

Figure 3:
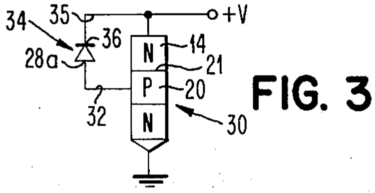
FIG. 3 is a circuit diagram representing the circuit of the embodiments of FIG. 1 and FIG. 2.

The circuit of the structure of Step 10 is illustrated in FIG. 3. Interconnection 32 connects base 20 to anode 28*a* of Schottky-barrier diode 34, while the interconnection 35 couples cathode 36 of Schottky-barrier 34 to collector 14 of transistor 30.

In the resulting integrated circuit shown in Step 10, a voltage in the order of +0.4 volt on anode 28*a*, with respect to cathode 36, will render Schottky-barrier diode 34 conductive in the forward direction. On the other hand, a positive voltage of at least +0.7 volt on base 20, with respect to collector 14, is required to forward-bias base-collector junction 21. Accordingly, it may be seen that base-collector junction 21 can never become forward-biased in the circuit shown in FIG. 3. As soon as the voltage on base 20, with respect to collector 14, reaches +0.4 volt, Schottky-barrier diode 34 is rendered conductive, providing a low resistance path or shunt to the collector which serves to prevent any further increase in the voltage on base 20. Because junction 21 is thus prevented from becoming forward-biased, transistor 30 is never driven into saturation which, in turn, permits faster switching time for transistor 30.

It is not necessary for the metallization providing the Schottky-barrier diode to be deposited in hole 28 simultaneously with the deposition of the ohmic contacts in holes 24, 25, 26 and 27. For example, the integrated circuit structure may be alternatively fabricated by only opening holes 24, 25, 26 and 27 in Step 8 and proceeding to form the platinum silicide ohmic contacts in these holes in the identical manner described above. Then, hole 28 may be opened up, after which the evaporated layer of molybdenum is deposited over the surface in the manner described above and the molybdenum interconnections are formed by subtractive etching as described above. In this alternative process, the molybdenum, in addition to providing the interconnections, will form Schottky-barrier anode 28*a*. The resulting Schottky-barrier diode will have a greater voltage barrier (in the order of +0.6 volt) than the previously described diode.

The circuit shown in FIG. 3 may be alternatively provided by another embodiment in which the connection between the cathode of the Schottky-barrier diode and the collector of the transistor is formed within the semiconductor structure rather than by means of a metallic surface interconnection. Referring to FIG. 2, low resistivity N+ zone 37 is formed in the surface of P-substrate 38 which has a resistivity in the order of 15 to 20 ohm-cm. and a thickness of about 10 mils. Zone 37 corresponds to previously described zones 11 and 12 in resistivity, impurity concentration and depth. In fact, the structure of Step 1 in FIG. 2 corresponds to the structure in Step 2 of FIG. 1 in all respects except that there is a single low resistivity zone rather than a pair of spaced zones. N-epitaxial layer 39, which is identical to previously described epitaxial layer 13, is then formed as shown in Step 2. In Step 3, zone 37 is out-diffused to form epitaxial zone 40 in a manner identical with the out-diffusion of previously described zones 11 and 12 to form zones 14 and 15. As shown in Step 4, low resistivity channel 41, which is identical in structure and composition with previously described low resistivity channels 16 and 17, is formed in the epitaxial layer in the same manner. Base diffusion 42, which is identical with previously described base diffusion 20, is made in the same manner as shown in Step 5. Next, as shown in Step 6, emitter region 43 is formed by conventional diffusion techniques, preferably utilizing a phosphorus source such as phosphorus oxychloride. The resistivity of emitter 43 is about 1 ohm-cm.

Subsequently, as shown in Step 7, ohmic contacts 44*a*, 45*a*, and 46*a* are formed in holes 44, 45, and 46 in insulating layer 48, and surface barrier contact 47*a* is deposited in hole 47 of said insulating layer. These contacts may be formed by either of the two alternative methods described in connection with the previous embodiment. Finally, when the metallic interconnections are deposited, only base contact 45*a* is connected to barrier contact 47*a* by interconnection 49. There is no need to couple the cathode of the Schottky-barrier diode to collector 40 by means of a surface metallic interconnection since collector 40 extends into the anode region of Schottky-barrier diode 50.

While platinum silicide has been described in the preferred embodiment as a desirable metal for both the ohmic contacts and the barrier contact, it should be clear that other metals conventionally used for ohmic contacts may be used for the ohmic contacts in the present structure and likewise, metals conventionally utilized for contacts in barrier diodes may be used for the barrier contacts. For example, metals such as platinum, palladium, chromium, molybdenum or nickel may be used for the barrier contact.

In the tailoring of integrated circuits of specific parameters, it may be desirable in the formation of the barrier contact to avoid temperatures which may cause sintering or combination with the deposited contact metal and the substrates. Under such circumstances, the hole in the insulating layer for the barrier contact may be formed by low temperature substractive RF sputtering and the barrier contact metal may subsequently be deposited into the hole also by such low temperature RF sputtering.

It should be noted that when the barrier diode contact is formed of an alloy of metal and the semiconductor epitaxial layer material such as platinum silicide, that the junction or interface between the alloy and the epitaxial layer will be slightly lower than the rest of the surface of this epitaxial layer. In such a case, the previously mentioned distances from the contact junction to the low resistivity epitaxial region should be determined from the actual junction rather than from the surface of the epitaxial layer.

As has been previously indicated, the metallic rectifying contact in the Schottky-barrier diode should be spaced from the low resistivity epitaxial region by a distance of less than 0.5 micron. For best results, the epitaxial layer should have a thickness of about 2 microns, in which case the low resistivity region should be out-diffused for a distance of 1.5 microns into the epitaxial layer. However, the structure of the present invention may be utilized with epitaxial layers having thickness in the order of 0.8 micron, in which case the low resistivity region is out-diffused for 0.3 micron into the epitaxial layer.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a monolithic integrated circuit chip, a diode comprising:

a high resistivity semiconductor substrate;

a low resistivity region of one type conductivity located along one surface portion of said substrate;

a high resistivity epitaxial semiconductor layer of said one type conductivity on said surface of said substrate, said epitaxial layer having a thickness of less than 2.5 microns and a conductivity-determining impurity concentration of less than $5\times10^{16}$ cm.$^{-3}$;

a low resistivity region of said one type conductivity formed in said epitaxial layer at the interface of the layer with the substrate by out-diffusion from said low resistivity region in the substrate and co-extensive with said substrate region;

a metallic rectifying contact formed on the surface of the epitaxial layer opposite to said low resistivity epitaxial region, said metallic contact being spaced from said low resistivity epitaxial region by a distance of less than 0.5 micron; and, electrical connections coupling said rectifying contact and said low resistivity epitaxial region respectively to other elements in the integrated circuit.

2. In a monolithic integrated circuit chip, a diode comprising:

a high resistivity semiconductor substrate;

a low resistivity region of one type conductivity located along one surface portion of said substrate;

a high resistivity epitaxial semiconductor layer of said one type conductivity on said surface of said substrate, said epitaxial layer having a thickness of less than 2.5 microns and a conductivity-determining impurity concentration of less than $5\times10^{16}$ cm.$^{-3}$;

a low resistivity region of said one type conductivity formed in said epitaxial layer at the interface of the layer with the substrate by out-diffusion from said low resistivity region in the substrate and co-extensive said substrate region;

a metallic rectifying contact formed on the surface of the epitaxial layer opposite to said low resistivity epitaxial region, said metallic contact being spaced from said low resistivity epitaxial region by a distance of less than 0.5 micron;

a metallic ohmic contact on the surface of said epitaxial layer and a low resistivity channel of said one type conductivity formed in said epitaxial layer extending from said ohmic contact to said low resistivity epitaxial region; and, electrical connections coupling said rectifying contact and said ohmic contact respectively to other elements in said integrated circuit.

3. The monolithic integrated chip of claim 2 wherein said semiconductor substrate is of a type conductivity opposite to said one type conductivity.

4. The monolithic integrated chip of claim 2 wherein said epitaxial layer has a maximum thickness of 2.0 microns.

5. A monolithic integrated circuit chip comprising:

a high resistivity semiconductor substrate;

a high resistivity epitaxial semiconductor layer of one type conductivity on the surface of said substrate, said epitaxial layer having a thickness of less than 2.5 microns and a conductivity-determining impurity concentration of less than $5\times10^{16}$ cm.$^{-3}$;

first and second spaced low resistivity regions of said one type conductivity located in said substrate at the interface with said epitaxial layer;

first and second spaced low resistivity regions of said one type conductivity formed in said epitaxial layer at said interface by out-diffusion from said low resistivity regions in the substrate and co-extensive with said regions;

a metallic rectifying contact formed on the surface of said epitaxial layer opposite to said first low resistivity epitaxial region, said metallic contact being spaced from said first low resistivity epitaxial region by a distance of less than 0.5 micron;

a region of opposite type conductivity extending from the surface of the epitaxial layer opposite to said second low resistivity epitaxial region to form a base-collector junction adjacent said second low resistivity epitaxial region;

a region of said one type conductivity extending from the surface of the epitaxial layer enclosed within said region of opposite type conductivity to form an emitter-base junction above said base-collector junction;

metallic ohmic contacts to said collector, base, and emitter regions formed on the surface of said epitaxial layer;

an electrical connection coupling said rectifying contact to said base region ohmic contact; and, an electrical connection coupling said first low resistivity epitaxial region to said collector.

6. A monolithic integrated circuit chip comprising:

a high resistivity semiconductor substrate;

a high resistivity epitaxial semiconductor layer of one type conductivity on the surface of said substrate, said epitaxial layer having a thickness of less than 2.5 microns and a conductivity-determining impurity concentration of less than $5\times10^{16}$ cm.$^{-3}$;

first and second spaced low resistivity regions of said one type conductivity located in said substrate at the interface with said epitaxial layer;

first and second spaced low resistivity regions of said one type conductivity formed in said epitaxial layer at said interface by out-diffusion from said low resistivity regions in the substrate and co-extensive with said regions;

a metallic rectifying contact formed on the surface of said epitaxial layer opposite to said first low resistivity epitaxial region, said metallic contact being spaced from said first low resistivity epitaxial region by a distance of less than 0.5 micron;

a metallic ohmic contact on the surface of said epitaxial layer and a low resistivity channel of said one type conductivity formed in said epitaxial layer extending from said ohmic contact to said first low resistivity epitaxial region;

a region of opposite type conductivity extending from the surface of the epitaxial layer opposite to said second low resistivity epitaxial region to form a base-collector junction adjacent said second low resistivity epitaxial region;

a region of said one type conductivity extending from the surface of the epitaxial layer enclosed within said region of opposite type conductivity to form an emitter-base junction above said base-collector junction;

metallic ohmic contacts to said collector, base and emitter regions formed on the surface of said epitaxial layer; and an electrical connection coupling said rectifying contact to said base region ohmic contact and an electrical connection coupling the ohmic contact of said first low resistivity epitaxial region to said collector ohmic contact.

7. The monolithic integrated circuit chip of claim 6 wherein said substrate is of opposite type conductivity.

8. The monolithic integrated circuit chip of claim 6 wherein said collector-base junction is continguous with said second low resistivity epitaxial region.

9. The monolithic integrated circuit chip of claim 6 wherein said epitaxial layer has a maximum thickness of 2.0 microns.

10. The monolithic integrated circuit chip of claim 6 having a low resistivity channel of said one type conductivity formed in said epitaxial layer extending from said collector contact to said second low resistivity epitaxial region.

11. The integrated circuit chip of claim 7 wherein said second low resistivity epitaxial region is separated from said first low resistivity epitaxial region by an isolation region of said opposite type conductivity extending through said epitaxial layer.

12. A monolithic integrated circuit chip comprising:

a high resistivity semiconductor substrate;

a high resistivity epitaxial semiconductor layer of one type conductivity on the surface of said substrate, said epitaxial layer having a thickness of less than 2.5 microns and a conductivity-determining impurity concentration of less than $5\times10^{16}$ cm.$^{-3}$;

a low resistivity region of said one type conductivity located in said substrate at the interface with said epitaxial layer;

a low resistivity region of said one type conductivity formed in said epitaxial layer at said interface by out-diffusion from said low resistivity region in the substrate and co-extensive with said region;

a metallic rectifying contact formed on the surface of said epitaxial layer opposite of said low resistivity epitaxial region, said metallic contact being spaced from said epitaxial region by a distance of less than 0.5 micron;

a region of opposite type conductivity spaced from said metallic rectifying contact extending from the surface of epitaxial layer opposite to said low resistivity epitaxial region to form a base-collector junction adjacent said low resistivity epitaxial region;

a region of said one type conductivity extending from the surface of the epitaxial layer enclosed within said region of opposite type conductivity to form an emitter-base junction above said base-collector junction;

metallic ohmic contact to said collector, base, and emitter regions formed on the surface of said epitaxial layer; and an electrical connection coupling said rectifying contact to said base region ohmic contact.

13. The monolithic integrated circuit chip of claim 12 wherein said substrate is of opposite type conductivity.

14. The monolthic integrated circuit chip of claim 12 wherein said collector-base region is contiguous with said low resistivity epitaxial region.

15. The integrated circuit chip of claim 1 wherein said rectifying contact comprises platinum.

16. The integrated circuit chip of claim 2 wherein said metallic contacts comprise platinum.

17. The integrated circuit chip of claim 16 wherein said contacts are platinum silicide.

18. The integrated circuit chip of claim 6 wherein said metallic contacts comprise platinum.

19. The integrated circuit chip of claim 6 wherein the ohmic contacts comprise platinum silicide.

20. A method of fabricating an integrated circuit comprising:

forming at a portion of one surafce of a high resistivity semiconductor substrate, a low resistivity region of one type conductivity;

forming a high resistivity epitaxial semiconductor layer of said one type conductivity on said surface of the substrate, said epitaxial layer having a thickness of less than 2.5 microns and a conductivity-determining impurity concentration of less than $5\times10^{16}$ cm.$^{-3}$;

controllably out-diffusing conductivity-determining impurities from said low resistivity region in said substrate into said epitaxial layer to form a corresponding low resistivity region of said one type conductivity extending for at least 0.3 micron into said epitaxial layer from the surface of said substrate and epitaxial layer;

forming in said epitaxial layer a region of opposite type conductivity extending from the surface of the epitaxial layer opposite to said low resistivity epitaxial region to form a collector-base junction adjacent said low resistivity epitaxial region;

forming by diffusion into said region of opposite type conductivity, a region of one type conductivity extending from the surface of the epitaxial layer enclosed within said region of opposite type conductivity to form an emitter-base junction above said base-collector junction;

forming an insulating layer on the surface of said epitaxial layer by selectively etching away portions of said insulating layer to expose portions of the collector region, base region and emitter region;

selectively depositing metal to form ohmic contacts in said exposed portions;

selectively etching away a portion of the insulating layer from the surface of said epitaxial layer opposite said low resistivity epitaxial region and spaced from said region of opposite type conductivity and depositing metal to form a rectifying contact in said exposed region; and, forming a metallic interconnection on the surface of said insulating layer respectively coupling said rectifying contact with said base contact.

21. This method of claim 20 wherein said semiconductor substrate is of said opposite type conductivity.

22. The method of claim 20 wherein the metal deposited to form the ohmic contacts is platinum.

23. A method of fabricating an integrated circuit comprising:

forming on one surface of a high resistivity semiconductor substrate, first and second spaced low resistivity regions of one type conductivity;

forming a high resistivity epitaxial semiconductor layer of said one type conductivity on said surface of the substrate, said epitaxial layer having a thickness of less than 2.5 microns and a conductivity-determining impurity concentration of less than $5\times10^{16}$ cm.$^{-3}$;

controllably out-diffusing conductivity-determining impurities from said first and second low resistivity regions in said substrate into said epitaxial layer to form corresponding low resistivity regions of said one type conductivity extending for at least 0.3 micron into said epitaxial layer from the interface of said substrate and epitaxial layer;

forming in said epitaxial layer a region of opposite type conductivity extending from the surface of the epitaxial layer opposite to said second low resistivity epitaxial region to form a base-collector junction adjacent said second low resistivity epitaxial region;

forming by diffusion into said region of opposite type conductivity, a region of said one type conductivity extending from the surface of the epitaxial layer enclosed within said region of opposite type conductivity to form an emitter-base junction above said base-collector junction;

diffusing through the surface of said epitaxial layer a low resistivity channel of said one type conductivity extending to said first low resistivity epitaxial region;

forming an insulating layer on the surface of said epitaxial layer by selectively etching away portions of said insulating layer to expose portions of the collector region, base region and emitter region and a portion of said low resistivity channel at the surface of said epitaxial layer;
selectively depositing metal to form ohmic contacts in said exposed portions;
selectively etching away a portion of said insulating layer from the surface of said epitaxial layer opposite first low resistivity epitaxial region and depositing metal to form a rectifying contact in said exposed region; and,
forming metallic interconnections on the surface of said insulating layer respectively coupling said rectifying contact with said base contact and said low resistivity channel contact with said collector contact.

24. The method of claim 23 wherein said semiconductor substrate is of said opposite type conductivity.

25. The method of claim 23 wherein the metal deposited to form the ohmic contacts is platinum.

26. The method of claim 23 wherein the metal deposited to form all of the contacts is platinum.

27. A method of fabricating an integrated circuit comprising:
forming at a portion of one surface of a high resistivity semiconductor substrate, a low resistivity region of one type conductivity;
forming a high resistivity epitaxial semiconductor layer of said one type conductivity on said surface of the substrate, said epitaxial layer having a thickness of less than 2.5 microns and a conductivity-determining impurity concentration of less than $5\times10^{16}$ cm.$^{-3}$;
controllably out-diffusing conductivity-determining impurities from said low resistivity region in said substrate into said epitaxial layer to form a corresponding low resistivity region of said one type conductivity extending for at least 0.3 micron into said epitaxial layer from the surface of said substrate and epitaxial layer;
forming in said epitaxial layer a region of opposite type conductivity extending for the surface of the epitaxial layer opposite to said low resistivity epitaxial region to form a collector-base junction adjacent said low resistivity epitaxial region;
forming by diffusion into said region of opposite type conductivity, a region of one type conductivity extending from the surface of the epitaxial layer enclosed within said region of opposite type conductivity to form an emitter-base junction above said base-collector junction;
forming an insulating layer on the surface of said epitaxial layer by selectively etching away portions of said insulating layer to expose portions of the collector region, base region and emitter region;
selectively depositing platinum in said exposed portions and sintering said platinum at a temperature of at least 500° C. to form ohmic contacts;
selectively etching away a portion of said insulating layer from the surface of said epitaxial layer opposite said low resistivity epitaxial region and spaced from said region of opposite type conductivity;
depositing a metal in said exposed area to form a rectifying contact; and,
forming a metallic interconnection on the surface of said insulating layer, respectively coupling said rectifying contact at said base contact.

28. The method of claim 27 wherein the metal forming the rectifying contact is deposited by sputtering.

References Cited

UNITED STATES PATENTS

| | | | |
|---|---|---|---|
| 3,271,636 | 9/1966 | Irvin | 317—235 |
| 3,451,912 | 6/1969 | O'Heurle et al. | 317—235 |
| 3,463,975 | 8/1969 | Biard | 317—235 |

JERRY D. CRAIG, Primary Examiner

U.S. Cl. X.R.

29—569; 148—175, 191; 307—303